(12) United States Patent
Hashigami et al.

(10) Patent No.: US 9,224,888 B2
(45) Date of Patent: *Dec. 29, 2015

(54) SOLAR CELL AND SOLAR-CELL MODULE

(75) Inventors: Hiroshi Hashigami, Annaka (JP); Naoki Ishikawa, Annaka (JP); Takenori Watabe, Annaka (JP); Hiroyuki Otsuka, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 64 days.

This patent is subject to a terminal disclaimer.

(21) Appl. No.: 13/992,015

(22) PCT Filed: Dec. 1, 2011

(86) PCT No.: PCT/JP2011/077787
§ 371 (c)(1),
(2), (4) Date: Jun. 6, 2013

(87) PCT Pub. No.: WO2012/077568
PCT Pub. Date: Jun. 14, 2012

(65) Prior Publication Data
US 2013/0255747 A1 Oct. 3, 2013

(30) Foreign Application Priority Data
Dec. 6, 2010 (JP) ................ 2010-271659

(51) Int. Cl.
*H01L 31/0224* (2006.01)
*H01L 31/068* (2012.01)

(52) U.S. Cl.
CPC ...... *H01L 31/022433* (2013.01); *H01L 31/068* (2013.01); *Y02E 10/547* (2013.01)

(58) Field of Classification Search
USPC ................ 136/244, 256, 261, 258
See application file for complete search history.

(56) References Cited

U.S. PATENT DOCUMENTS

| 5,928,438 A | 7/1999 | Salami et al. |
| 6,632,730 B1 | 10/2003 | Meier et al. |

(Continued)

FOREIGN PATENT DOCUMENTS

| EP | 0 999 598 A1 | 5/2000 |
| JP | 05-036998 A | 2/1993 |

(Continued)

OTHER PUBLICATIONS

International Search Report for PCT/JP2011/077787, Mailing Date of Jan. 10, 2012.

(Continued)

*Primary Examiner* — Jayne Mershon
(74) *Attorney, Agent, or Firm* — Westerman, Hattori, Daniels & Adrian, LLP

(57) ABSTRACT

A solar cell has a passivation film formed on a crystalline silicon substrate that has at least a p-n junction, and an electrode formed by printing and heat-treating a conductive paste. The solar cell has a first electrode comprising an extraction electrode, which extracts photogenerated carriers from the silicon substrate, formed so as to contact the silicon substrate and a second collector electrode, which collects the carriers collected at the extraction electrode, formed so as to contact the first electrode. Other than the point of contact between the first electrode and the second electrode, at least, the second electrode contacts the silicon substrate only partially or not at all. By leaving the passivation film between the collector electrode and the silicon, either completely or partially, the solar cell reduces charge losses at electrode/silicon interfaces, improves the short-circuit current and open voltage, and yields improved characteristics.

10 Claims, 3 Drawing Sheets

(56) References Cited

U.S. PATENT DOCUMENTS

| | | | |
|---|---|---|---|
| 2002/0148499 A1* | 10/2002 | Tanaka | 136/256 |
| 2003/0160026 A1 | 8/2003 | Klein et al. | |
| 2005/0194037 A1 | 9/2005 | Asai | |
| 2009/0250108 A1 | 10/2009 | Zhou et al. | |
| 2009/0260684 A1 | 10/2009 | You | |
| 2010/0126551 A1 | 5/2010 | Okamoto et al. | |
| 2010/0132792 A1 | 6/2010 | Kim et al. | |
| 2010/0147378 A1 | 6/2010 | Lee et al. | |
| 2010/0218826 A1* | 9/2010 | Hahn et al. | 136/261 |
| 2010/0252105 A1* | 10/2010 | Fork et al. | 136/256 |
| 2012/0052191 A1* | 3/2012 | Fork et al. | 427/75 |

FOREIGN PATENT DOCUMENTS

| | | |
|---|---|---|
| JP | 06-252428 A | 9/1994 |
| JP | 11-512886 A | 11/1999 |
| JP | 2000-138386 A | 5/2000 |
| JP | 2003-529207 A | 9/2003 |
| JP | 2003-531807 A | 10/2003 |
| JP | 2004-273826 A | 9/2004 |
| JP | 2006-041309 A | 2/2006 |
| JP | 2006-156693 A | 6/2006 |
| JP | 2007-096040 A | 4/2007 |
| JP | 2007-299844 A | 11/2007 |
| JP | 2008-204967 A | 9/2008 |
| JP | 2009-246214 A | 10/2009 |
| JP | 2009-295715 | * 12/2009 |
| JP | 2009-295715 A | 12/2009 |
| WO | 2006/129444 A1 | 12/2006 |
| WO | 2009/128679 A2 | 10/2009 |
| WO | 2010/119512 A1 | 10/2010 |

OTHER PUBLICATIONS

International Written Opinion for PCT/JP2011/077787, Mailing Date of Jan. 10, 2012.

Knobloch. J., et al. "High-Efficiency Solar Cells From FZ, CZ and MC Silicon Material", Proc. The 23rd IEEE Photovoltaic Specialists Conference, 1993, pp. 271-276.

Glunz. S.W., et al. "New Simplified Method for Pattening the Rear Contact of RP-Perc High-Efficiency Solar Cells", Proc. The 28th IEEE Photovoltaic Specialists Conference, 2000, pp. 168-171.

International Search Report for PCT/JP2011/077784 (corresponding to U.S. Appl. No. 13/991,978, mailing date of Jan. 10, 2012; With English translation (4 pages).

Singaporean Search Report dated Nov. 5, 2014, issued in Singaporean application No. 2013043831 (8 pages)(corresponding to U.S. Appl. No. 13/991,978) (8 pages).

Singaporean Written Opinion dated Nov. 5, 2014, issued in Singaporean application No. 2013043831 (11 pages)(corresponding to U.S. Appl. No. 13/991,978) (11 pages).

D. L. Meier et al., "Self-Doping Contacts to Silicon Using Silver Coated With a Dopant Source", Proc. the 28th IEEE Photovoltaic Specialists Conference, pp. 69-74, (2000), Cited in U.S. Appl. No. 13/991,978.

Chinese Office Action dated Apr. 23, 2015, issued in corresponding CN Patent Application No. 201180065728.7 with English translation (26 pages).

US Non Final Office Action dated Apr. 24, 2015, issued in U.S. Appl. No. 13/991,978 (30 pages).

* cited by examiner

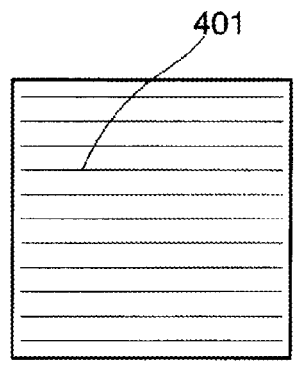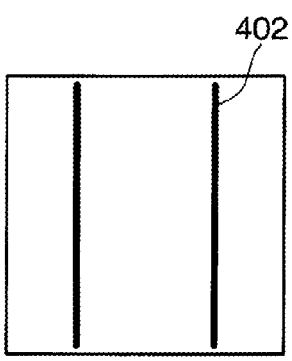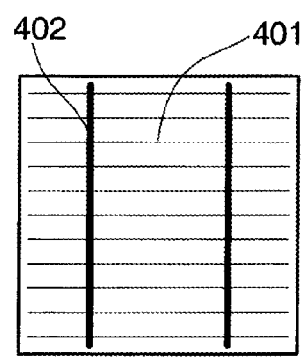
FIG.4A FIG.4B FIG.4C
FIG.5
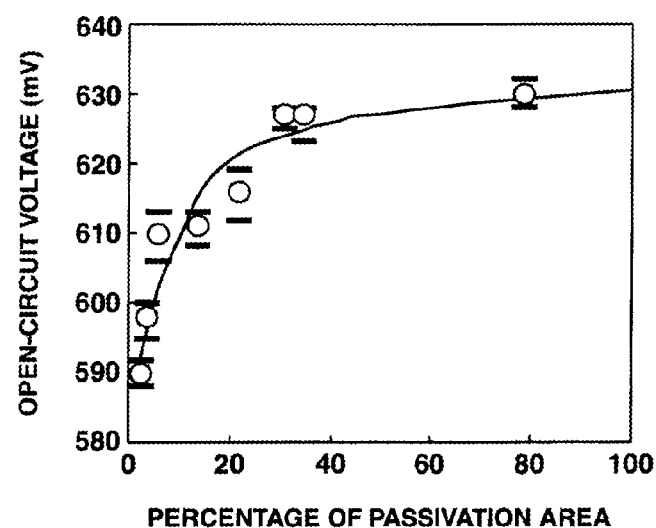

SOLAR CELL AND SOLAR-CELL MODULE

TECHNICAL FIELD

This invention relates to a solar cell and solar cell module having the advantages of low cost and high efficiency.

BACKGROUND ART

FIG. 1 illustrates one general solar cell of mass production model using a mono- or polycrystalline silicon substrate. The solar cell includes a silicon substrate 101 in which an impurity is diffused at a high concentration to form a diffusion layer 102 and a p-n junction, and electrodes on its light-receiving surface. The electrodes include a multiplicity of electrodes (referred to as extraction electrodes) 104 of several hundreds to several tens of microns (μm) wide, and several collector electrodes 105 as the electrode for integrating the extraction electrodes together and interconnecting solar cells. While these electrodes may be formed by various methods, one method commonly employed from the standpoint of cost is by printing a metal paste comprising fine particles of metal such as Ag and an organic binder through a screen or the like, and heat treating at a temperature of several hundred degree centigrade for bonding to the substrate. On the surface of the substrate opposite to the light-receiving surface, a back electrode 106 of opposite polarity to the light-receiving side electrode is formed by using a metal paste comprising fine particles of metal such as Al and an organic binder, screen printing, and firing at a temperature of about 700 to 850° C. In the region where light is incident on the solar cell, an antireflective film 103 is formed for efficiently taking in light. A silicon nitride film which is formed by chemical vapor deposition (CVD) or the like is commonly used as the antireflective film.

The antireflective film also has a further important function of passivating the silicon surface. In the interior of crystals, silicon atoms are in a stable state due to the covalent bond between adjacent atoms. However, at the surface corresponding to the terminus of atom arrangement, where no adjacent atom to be bonded is available, an unstable energy level known as "dangling bond" appears. Since the dangling bond is electrically active, it captures and extinguishes charge photogenerated within silicon, detracting from the operation of a solar cell. To suppress the loss, the solar cells have been subjected to surface passivating treatment or otherwise treated to reduce dangling bonds.

On the other hand, it is known that dangling bonds are not passivated at the interface where metal and silicon contact, and a recombination rate of carriers is very high thereat. That is, an electrode must be contacted with the silicon surface for extracting photogenerated carriers whereas the silicon/electrode interface becomes a significant loss component to solar cell characteristics. Therefore, for high-efficiency solar cells, some approaches are taken to minimize the contact area between silicon and electrode. Such approaches include narrow contact and point contact structures. These structures are formed by partially removing the passivation film by photolithography (see, for example, J. Knobloch, A. Noel, E. Schaffer, U. Schubert, F. J. Kamerewerd, S. Klussmann, W. Wettling, Proc. the 23rd IEEE Photovoltaic Specialists Conference, p. 271, 1993) or etching paste printing, to expose the underlying silicon, and evaporating or printing a metal thereon. An alternative method is by forming a metal film on the passivation film, irradiating laser light as spots thereto to heat the metal, and letting the metal penetrate through the passivation film, for thereby forming silicon/electrode contacts (see, for example, S. W. Glunz, R. Preu, S. Schaefer, E. Schneiderlochner, W. Pfleging, R. Ludemann, G. Willeke, Proc. the 28th IEEE Photovoltaic Specialists Conference, p. 168, 2000).

SUMMARY OF INVENTION

Technical Problem

However, formation of narrow contact or point contact structure electrodes requires increased costs because of many steps involved and also because a resist material, etching paste or the like is newly necessary for patterning, failing to take full advantage of the passivation effect. Also, the method using laser requires an expensive apparatus and cumbersome evaporation and other steps for metal film formation, suggesting that the merits are economically offset.

An object of the invention which is made under the aforementioned circumstances is to provide a solar cell and solar cell module having the advantages of reduced charge losses at the electrode/silicon interface, improved short-circuit current and open-circuit voltage, improved solar cell characteristics, and manufacture at low costs.

Solution to Problem

To attain the above object, the invention provides a solar cell and solar cell module as defined below.

[1] A solar cell comprising a crystalline silicon substrate having at least a p-n junction, a passivation film formed thereon, and electrodes formed thereon by printing and heat treating a conductive paste, characterized in that the electrodes include a first electrode which is formed such that an extraction electrode may contact the silicon substrate for extracting photogenerated carriers from the silicon substrate, and a second electrode which is formed such that a collector electrode may contact the first electrode for collecting the carriers drawn in the first electrode, and the second electrode and the silicon substrate contact only partially or nowhere at least outside the point of contact between the first and second electrodes.

[2] The solar cell of [1] wherein the area of the non-contact portion between the second electrode and the silicon substrate, excluding the area of a contact portion between the first and second electrodes, accounts for at least 20% of the area equal to the area given by the width and the overall length of the second electrode minus the area of a contact portion between the first and second electrodes.

[3] The solar cell of [1] or [2] wherein the first electrode is partially contacted or entirely overlaid with the second electrode.

[4] The solar cell of any one of [1] to [3] wherein the first electrode is formed from a conductive paste containing B, Al, Ga, P, As, In or Sb alone or a compound thereof, and a region having a high concentration of the element diffused therein is included in the silicon substrate beneath the first electrode.

[5] The solar cell of any one of to [4] wherein the passivation film comprises silicon oxide, silicon nitride, silicon carbide, aluminum oxide, amorphous silicon, microcrystalline silicon or titanium oxide or a combination thereof.

[6] The solar cell of any one of [1] to [5] wherein the collector electrode comprising the first and second electrodes combined is formed on a light-receiving surface or a non-light-receiving surface of the solar cell or both.

[7] A solar cell module comprising electrically connected solar cells according to any one of [1] to [6].

Advantageous Effects of Invention

Since the passivation film is completely or partially left between the collector electrode and the silicon, the invention reduces charge losses at the electrode/silicon interface, improves the short-circuit current and open-circuit voltage, and ameliorates solar cell characteristics. Furthermore, the process can be implemented using the existing screen-printing technology or the like, which is extremely effective in reducing costs.

BRIEF DESCRIPTION OF DRAWINGS

FIG. 4 is a plan view of a printing plate for use in electrode formation according to the invention, (a) showing a pattern of extraction electrode alone, (b) showing a pattern of collector electrode alone, and (c) showing a combined pattern of extraction and collector electrodes.

FIG. 5 is a diagram showing one impact on solar cell characteristics according to the invention.

DESCRIPTION OF EMBODIMENTS

Figure 1:
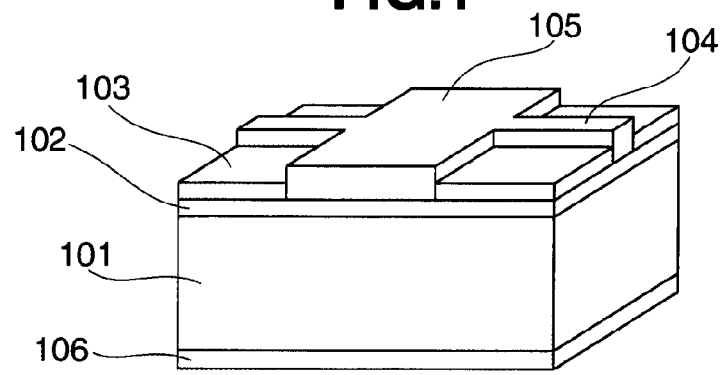
FIG. 1 is a schematic perspective view of an exemplary structure of a conventional solar cell.
Figure 2:
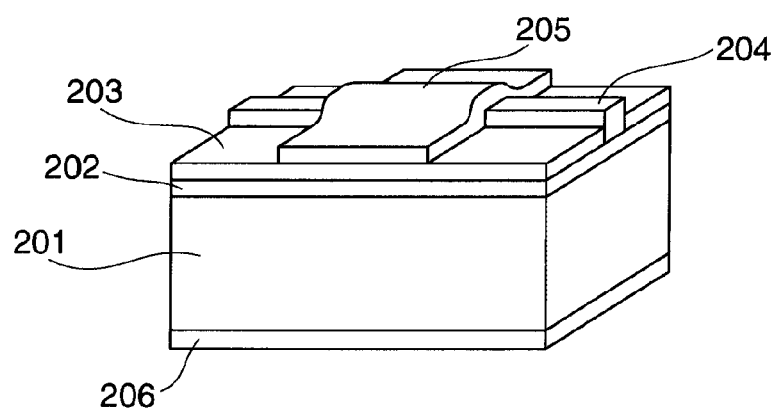
FIG. 2 is a schematic perspective view of an exemplary structure of a solar cell in one embodiment of the invention.

FIG. 2 illustrates a solar cell in one embodiment of the invention. The solar cell includes a silicon substrate 201 in which an impurity is diffused at a high concentration to form a diffusion layer 202 and a p-n junction, that is, silicon substrate 201 having at least a p-n junction, a passivation film 203 formed thereon, and electrodes formed thereon by printing and heat treating a conductive paste. The electrodes include a first electrode 204 which is formed such that an extraction electrode may contact the silicon substrate for extracting photogenerated carriers from the silicon substrate, and a second electrode 205 which is formed such that a collector electrode may contact the first electrode 204 for collecting the carriers drawn in the first electrode 204. At least the second electrode 205 and the high concentration diffusion layer 202 contact only partially or nowhere outside the point of contact between the first and second electrodes 204 and 205. This enables passivation of the silicon surface beneath the second electrode 205. Notably, a back electrode is depicted at 206.

In a preferred embodiment, the area of the non-contact portion between the second electrode and the silicon substrate, excluding the area of a contact portion between the first and second electrodes, accounts for at least 20%, especially 40 to 100% of the area equal to the area given by the width and the overall length of the second electrode minus the area of a contact portion between the first and second electrodes.

Also, the second electrode is preferably formed of a conductive paste having a less content of glass frit than the glass frit content in the conductive paste of which the first electrode is formed. Specifically, the second electrode is preferably formed of a conductive paste having a glass frit content of up to 2% by weight, more preferably up to 1% by weight. The glass frit content may even be 0% by weight.

In this embodiment, the first electrode is preferably formed of a conductive paste having a glass frit content of 8 to 20% by weight, more preferably 8 to 10% by weight. A glass frit content of less than 8% by weight may result in insufficient contact with the high-concentration diffusion layer, which can increase electric resistance and degrade solar cell characteristics. A glass frit content of more than 20% by weight indicates an excess of electrically insulating glass component, which may result in a lowering of conductivity of the electrode itself, and excessive infiltration of glass component in between the electrode and the high-concentration diffusion layer, leading to increased electric resistance and degraded solar cell characteristics.

Figure 3:
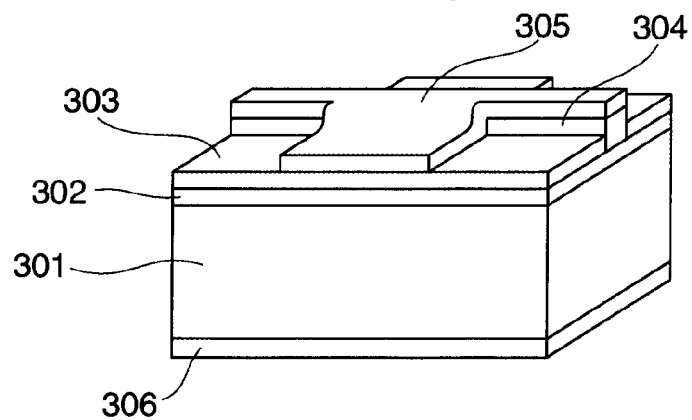
FIG. 3 is a schematic perspective view of an exemplary structure of a solar cell in another embodiment of the invention.

Although the first electrode 204 is partially contacted with the second electrode 205 in the solar cell of FIG. 2, the first electrode 304 may be entirely overlaid with the second electrode 305 as shown in FIG. 3. Notably, a silicon substrate 301, a high-concentration diffusion layer 302, a passivation film 303, and a back electrode 306 are illustrated in FIG. 3.

Preferably, the first electrode is formed of a conductive paste containing B, Al, Ga, P, As, In or Sb alone or a compound thereof. Then a region having the element diffused at a high concentration is formed in the silicon substrate beneath the first electrode.

Preferably the second electrode has a higher resistivity than the first electrode.

It is noted that the passivation film is preferably formed of silicon oxide, silicon nitride, silicon carbide, aluminum oxide, amorphous silicon, microcrystalline silicon or titanium oxide or a combination thereof.

Preferably, the collector electrode comprising the first and second electrodes combined is formed on a light-receiving surface or a non-light-receiving surface of the solar cell or both.

Now, one exemplary method of fabricating a solar cell according to the invention is described. The invention is not limited to the solar cell fabricated by this method.

An as-cut monocrystalline {100} p-type silicon substrate in which high purity silicon is doped with a Group III element such as B or Ga so as to give a resistivity of 0.1 to 5 Ω-cm is etched with a conc. alkali solution of sodium hydroxide or potassium hydroxide having a concentration of 5 to 60% by weight or mixed acid of hydrofluoric acid and nitric acid for removing the work damaged surface layer. The monocrystalline silicon substrate may have been prepared by either the CZ or FZ method. Notably, a monocrystalline {100} n-type silicon substrate in which high purity silicon is doped with a Group V element such as P or Sb so as to give a resistivity of 0.1 to 5 Ω-cm may be used instead. Besides the monocrystalline silicon, polycrystalline silicon substrates prepared by the casting or ribbon growth method may also be used.

Subsequently, the substrate surface is provided with microscopic asperities known as texture. The texture is an effective means for lowering the reflectivity of solar cells. The texture may be readily provided by immersing the substrate in a hot alkaline solution of sodium hydroxide, potassium hydroxide, potassium carbonate, sodium carbonate, sodium hydrogencarbonate or tetramethylammonium hydroxide (concentration 1 to 10 wt %) at a temperature of 60 to 100° C. for about 10 to about 30 minutes. Often, a proper amount of 2-propanol is dissolved in the alkaline solution to control the reaction.

The texturing is followed by washing with an aqueous acidic solution such as hydrochloric acid, sulfuric acid, nitric acid or hydrofluoric acid or a mixture thereof. Washing with hydrochloric acid is preferred from the cost and property standpoints. To enhance cleanness, washing may be carried out by mixing 0.5 to 5 wt % of hydrogen peroxide with aqueous hydrochloric acid and heating at 60 to 90° C.

On the substrate, a high-concentration diffusion layer is formed by vapor phase diffusion using phosphorus oxychloride. In the other embodiment using an n-type substrate, the high-concentration diffusion layer is formed by vapor phase diffusion of boron bromide or otherwise. In common silicon solar cells, a p-n junction must be formed only on the light-receiving side. To this end, suitable means must be taken for avoiding any p-n junction on the back surface, for example, by carrying out diffusion while two substrates are mated together, or by etching away the diffusion layer on one side in aqueous alkaline solution or the like. At the end of diffusion, the glass formed on the surface is removed using hydrofluoric acid or the like.

Next, an antireflection/passivation film is formed on the light-receiving surface. Using a chemical vapor deposition system for film formation, a silicon nitride or similar film is deposited to a thickness of about 100 nm. Often a mixture of monosilane ($SiH_4$) and ammonia ($NH_3$) is used as the reactant gas although nitrogen may be used instead of $NH_3$. Also the desired refractive index may be obtained by using $H_2$ gas to dilute the film-forming species, to adjust the process pressure, or to dilute the reactant gas. The film is not limited to silicon nitride, and may be replaced by silicon oxide, silicon carbide, aluminum oxide, amorphous silicon, microcrystalline silicon or titanium oxide which is formed by heat treatment, atomic layer deposition or the like.

The passivation film is not limited to silicon nitride film, and it may comprise silicon oxide, silicon carbide, aluminum oxide, amorphous silicon, microcrystalline silicon or titanium oxide or a combination thereof, as mentioned just above. These films may be deposited by the standard technique.

Next, only an extraction electrode corresponding to a first electrode is screen printed on the light-receiving surface of the substrate using a printing plate having a pattern as shown in FIG. 4(a). Once a silver paste is prepared by mixing silver powder and glass frit with an organic binder, the paste is printed and heat treated so that silver particles may penetrate through the passivation film, typically silicon nitride film to establish electrical conduction between the electrode and the silicon. In FIG. 4, a first electrode printing pattern is depicted at 401 and a second electrode printing pattern depicted at 402.

In order to enhance the fill factor of the solar cell by reducing the ohmic contact between the first electrode and the silicon substrate to a lower resistance, a high-concentration impurity diffusion layer may be formed in the silicon substrate beneath the first electrode. If B, Al, Ga, P, As, In or Sb alone or a compound thereof is previously added to the first electrode-forming conductive paste, then a high-concentration impurity diffusion layer can be formed in the silicon substrate at the same time as the firing step following electrode paste printing. Although the amount of the impurity added to the conductive paste varies with the composition of conductive paste, it is generally recommended from a consideration of the work functions of metal and silicon to adjust the impurity amount such that the high-concentration impurity diffusion layer formed in the silicon substrate may have a maximum impurity concentration of at least $2\times10^{19}$ atoms/$cm^3$, more preferably at least $5\times10^{19}$ atoms/$cm^3$. The upper limit of impurity concentration is $2\times10^{22}$ atoms/$cm^3$.

On the first electrode thus formed, a collector electrode corresponding to a second electrode is screen printed. The printing plate for the second electrode may bear a pattern of collector electrode alone as shown in FIG. 4(b), or a printing plate bearing a pattern of extraction and collector electrodes combined as shown in FIG. 4(c) may be used whereby the first electrode may be overcoated. In the latter case, solar cell characteristics may be further improved by setting the conductivity of the second electrode higher than the conductivity of the first electrode for thereby reducing the electrode resistance loss.

As the second electrode-forming silver paste, a paste in which additives are modified so that the passivation film fire-through capability of the second electrode-forming silver paste may be lower than that of the first electrode-forming silver paste is used for the purpose of retaining the passivation film other than the first electrode-forming region.

The passivation film fire-through capability of conductive paste can be controlled by the content of glass frit in the paste. The glass frit used herein is preferably selected from glass materials including B—Pb—O, B—Si—Pb—O, B—Si—Pb—Al—O, B—Si—Bi—Pb—O, and B—Si—Zn—O materials.

The back electrode is formed by mixing aluminum powder with an organic binder and screen printing the resulting paste. Printing is followed by firing at a temperature of 700 to 850° C. for 5 to 30 minutes to form the back electrode and second electrode. Firing of the back electrode and the light-receiving surface electrode may be performed at a time. Also, the order of forming electrodes on opposite surfaces may be reversed.

The electrode forming method is not limited to screen printing and may be performed by dispenser, aerosol spraying or the like.

EXAMPLES

Examples and Comparative Examples are given below by way of illustration and not by way of limitation.

Experiment

Study on Area of Passivation Film beneath Second Electrode and Glass Frit Content of Conductive Paste Solar cell characteristics were examined as a function of the area of the passivation film left beneath the second electrode (i.e., non-contact area between second electrode and silicon).

A paste was prepared by mixing silver powder, an organic binder and B—Pb—O glass frit. The paste was printed onto a silicon substrate having a high-concentration diffusion layer formed therein and a silicon nitride film (passivation film) of 100 nm thick deposited thereon, and fired, yielding a solar cell. The cell was immersed in aqua regia to dissolve away all the electrodes therefrom. By dicing, the electrode-forming region was cut out as a test sample. An open-circuit voltage was measured by placing probes at opposite surfaces of the sample, and irradiating simulative sunlight with AM 1.5 to the light-receiving surface.

FIG. 5 shows the open-circuit voltage versus a percentage of the area of the passivation film left beneath the electrode. The percentage of the area of the passivation film is an average of 6 samples for each conductive paste. For the open-circuit voltage, an average, maximum and minimum values are plotted.

As seen from FIG. 5, the rise of open-circuit voltage slowed down near a beneath-electrode passivation area of 20% and the voltage became substantially saturated at an area of 40% or greater. It is regarded preferable from these results that the passivation area beneath second electrode accounts for at least 20%, more preferably at least 40% of the second electrode area.

Figure 6:
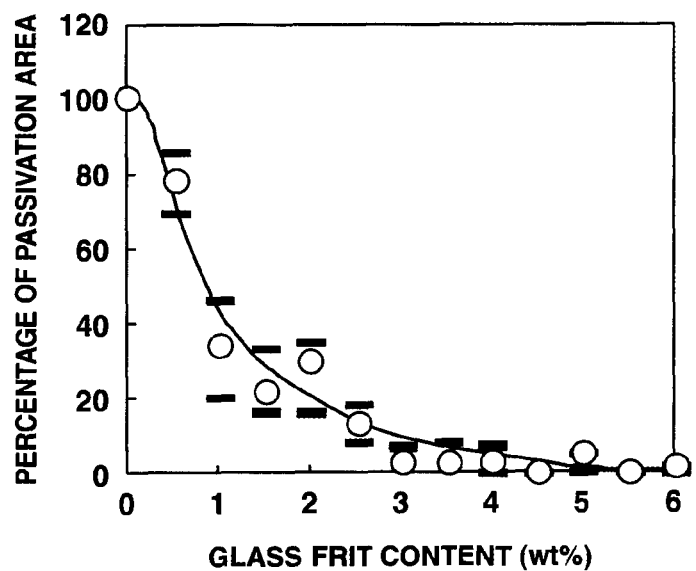
FIG. 6 is a diagram showing the impact of the amount of glass frit added according to the invention.

In the diagram of FIG. 6, the glass frit content of silver paste used in the test is on the abscissa and the percentage of the area of the passivation film left beneath the second electrode is on the ordinate. The glass frit content of silver paste which results in a beneath-electrode passivation area of 20% and 40% is about 2% and 1% by weight, respectively.

Figure 7:
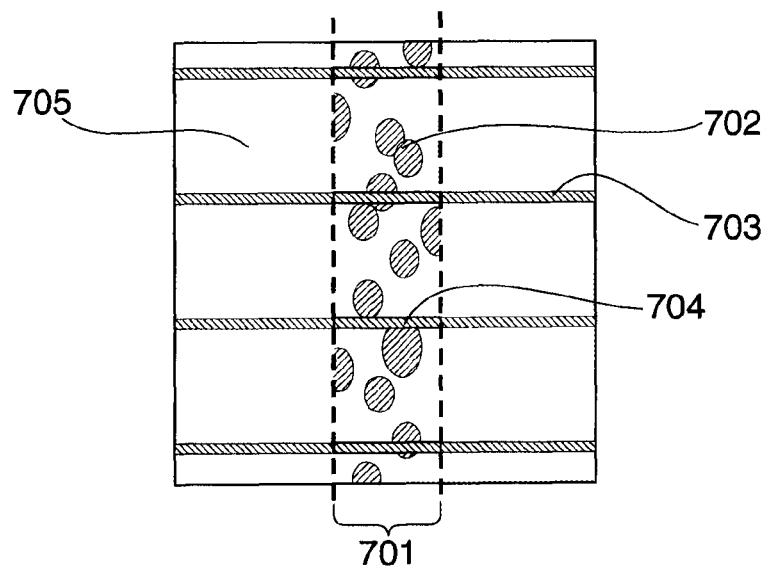
FIG. 7 is a view illustrating the area of passivation film beneath electrodes according to the invention.

The passivation area beneath the second electrode will be understood from FIG. 7.

FIG. 7 schematically illustrates a sample surface of the second electrode-forming region in the solar cell from which the electrodes have been dissolved away. The passivation area is defined as equal to [the area delimited inside a second electrode-forming region 701 and excluding first/second electrode intersections 704 (that is, net second electrode area)] minus [the total area of spots 702 where the second electrode penetrates through the passivation film 705].

A percentage of passivation area is a ratio of the passivation area to the net second electrode area. The passivation area can be measured by taking a surface image by a digital camera and image processing.

Examples and Comparative Examples

To demonstrate the benefits of the invention, a solar cell having a conventional electrode structure as comparison and a solar cell having an electrode structure according to the invention are compared for electricity generating ability.

There were provided 100 as-cut boron-doped {100} p-type silicon substrates having a diffusion depth of 250 μm and a resistivity of 1 Ω-cm. The substrates were immersed in a hot conc. potassium hydroxide aqueous solution to remove the work damaged layer, immersed in a potassium hydroxide/2-propanol aqueous solution to form a texture, and then washed in a hydrochloric acid/hydrogen peroxide mixture. Next, the substrates, with their back surfaces mated, were heat treated at 870° C. in a phosphorus oxychloride atmosphere to form a p-n junction. After diffusion, phosphorus glass was removed with hydrofluoric acid, followed by washing with deionized water and drying.

Thereafter, using a plasma-enhanced CVD system, a silicon nitride film was deposited over the sample surface as a light-receiving side antireflection/passivation film.

At this point of time, the substrates were divided into two groups A and B, each consisting of 50 substrates. On the substrates of group A, using a printing plate having a pattern of first and second electrodes on a common screen as shown in FIG. 4(c), first and second electrodes were simultaneously printed once and dried. On the substrates of group B, using a printing plate having a pattern of first electrode alone on a screen as shown in FIG. 4(a), only first electrode was printed and dried. An identical silver paste was used for groups A and B while the paste contained 3% by weight of B—Si—Bi—Pb—O glass frit and further contained 3% by weight of a phosphorus compound for forming a high-concentration diffusion layer.

Next, aluminum paste was screen printed over the back surface of all the substrates and dried. Thereafter, firing at 780° C. was carried out in air atmosphere for causing the silver electrode to penetrate through the silicon nitride film to establish conduction to silicon and simultaneously causing the aluminum electrode on the back surface to establish conduction to silicon. In group A, the electrode established conduction to silicon over its entire extent, indicating that the non-contact area between electrode and silicon was 0%. In group B, a printing plate of FIG. 4(c) was used to form a second electrode, and the second electrode was formed to overlie the first electrode. A silver paste was prepared by adjusting the amount of glass frit added such that the non-contact area between second electrode and silicon might be 80% and adjusting ingredients such that the paste might have a higher conductivity than the first electrode-forming paste, and this silver paste was coated by screen printing and heat treated at 750° C. in air atmosphere for curing.

In order that group A follow the same thermal history as group B, group A was subjected to heat treatment at 750° C. in air atmosphere in the same firing furnace as group B.

The solar cells of groups A and B were measured for cell characteristics by a current-voltage tester using simulative sunlight with AM 1.5. As seen from Table 1, the cells of group B according to the invention show superior characteristics to group A.

TABLE 1

| | Short-circuit current (mA/cm$^2$) | Open-circuit voltage (V) |
|---|---|---|
| Group A (prior art) | 36.0 | 0.622 |
| Group B (invention) | 36.2 | 0.629 |

The invention claimed is:

1. A solar cell comprising a crystalline silicon substrate having at least a p-n junction, a passivation film formed thereon, and electrodes formed thereon by printing and heat treating a conductive paste, characterized in that
the electrodes include a first electrode consisting of an extraction electrode which may contact the silicon substrate for extracting photogenerated carriers from the silicon substrate, and a second electrode consisting of extraction and collector electrodes having a higher conductivity than the first electrode, which is formed on the first electrode and passive film, wherein the first electrode is entirely overlaid with the extraction electrode portion and a part of the collector electrode portion of the second electrode, the collector electrode portion of the second electrode may contact the first electrode partially for collecting the carriers drawn in the first electrode, and the collector electrode portion of the second electrode and the silicon substrate contact only partially or nowhere outside the point of contact between the first electrode and the collector electrode portion of the second electrode.

2. The solar cell of claim 1 wherein the area of the non-contact portion between the collector electrode portion of the second electrode and the silicon substrate, excluding the area of a contact portion between the first electrode and the collector electrode portion of the second electrodes, accounts for at least 20% of the area equal to the area given by the width and the overall length of the collector electrode portion of the second electrode minus the area of a contact portion between the first electrode and the collector electrode portion of the second electrodes.

3. The solar cell of claim 1 wherein the first electrode is formed from a conductive paste containing B, Al, Ga, P, As, In or Sb alone or a compound thereof, and a region having a high concentration of the element diffused therein is included in the silicon substrate beneath the first electrode.

4. The solar cell of claim 3 wherein the passivation film comprises silicon oxide, silicon nitride, silicon carbide, aluminum oxide, amorphous silicon, microcrystalline silicon or titanium oxide or a combination thereof.

5. The solar cell of claim 4 wherein the collector electrode comprising the first and second electrodes combined is formed on a light-receiving surface or a non-light-receiving surface of the solar cell or both.

6. A solar cell module comprising electrically connected solar cells according to claim 5.

7. A method for manufacturing a solar cell of claim 1, comprising of steps:
forming a diffusion layer on a surface of a crystalline silicon substrate to form a p-n junction,
forming a passivation film on the diffusion layer,
printing a first conductive paste containing conductive powder and glass frit on the passivation film using a printing plate having a pattern of an extraction electrode alone,
firing the printed first conductive paste to form an extraction electrode as a first electrode which penetrates through the passivation film to establish electrical conduction to the silicon substrate,
printing a second conductive paste having a less content of glass frit than the glass frit content in the first conductive paste or zero content of glass frit on the first electrode and the passivation film using a printing plate having a pattern of extraction and collector electrodes combined so as to overlie the first electrode, and
firing the printed second conductive paste to form extraction and collector electrodes as a second electrode having a higher conductivity than the first electrode, wherein the first electrode is entirely overlaid with the extraction electrode portion and a part of the collector electrode portion of the second electrode, the collector electrode portion of the second electrode may contact the first electrode partially for collecting the carriers drawn in the first electrode, and the collector electrode portion of the second electrode and the silicon substrate contact only partially or nowhere outside the point of contact between the first electrode and the collector electrode portion of the second electrode.

8. The method of claim 7 wherein the area of the non-contact portion between the collector electrode portion of the second electrode and the silicon substrate, excluding the area of a contact portion between the first electrode and the collector electrode portion of the second electrode, accounts for at least 20% of the area equal to the area given by the width and the overall length of the collector electrode portion of the second electrode minus the area of a contact portion between the first electrode and the collector electrode portion of the second electrode.

9. The method of claim 7 wherein the glass frit content of the first conductive paste is 8 to 20% by weight, and the glass frit content of the second conductive paste is 0 to 2% by weight.

10. The method of claim 7 wherein the first conductive paste contains B, Al, Ga, P, As, In or Sb alone or a compound thereof, and a region having a high concentration of the element diffused therein is formed in the silicon substrate beneath the first electrode.

* * * * *